(12) United States Patent
Wei

(10) Patent No.: US 6,404,635 B1
(45) Date of Patent: Jun. 11, 2002

(54) HEAT SINK DEVICE FASTENING STRUCTURE

(76) Inventor: Wen-Chen Wei, P.O. Box No. 6-57, Chung-Ho City, Taipei Hsien 235 (TW)

(*) Notice: Subject to any disclaimer, the term of this patent is extended or adjusted under 35 U.S.C. 154(b) by 0 days.

(21) Appl. No.: 09/755,162

(22) Filed: Jan. 8, 2001

(51) Int. Cl.[7] .................................................. H05K 7/20
(52) U.S. Cl. ...................... 361/704; 361/709; 361/710; 257/718; 257/719; 257/727; 174/16.3; 165/80.3
(58) Field of Search ................................. 361/704, 706, 361/707, 709, 710; 257/717, 718, 719, 727; 174/16.3; 165/80.3, 185; 24/457, 458, 459; 248/505, 510

(56) References Cited

U.S. PATENT DOCUMENTS

| | | | |
|---|---|---|---|
| 5,600,540 A | * | 2/1997 | Blomquist .................. 361/704 |
| 5,860,195 A | * | 1/1999 | Wang .......................... 24/459 |
| 5,953,212 A | * | 9/1999 | Lee ............................ 361/709 |
| 6,256,846 B1 | * | 7/2001 | Lee ............................. 24/459 |

* cited by examiner

Primary Examiner—Boris L. Chervinsky
(74) Attorney, Agent, or Firm—Troxell Law Office PLLC

(57) ABSTRACT

The invention herein relates to a heat sink device fastening structure, comprises of a press-fastening member and a retaining member, wherein the press-fastening member with resilience, the retaining holes set respectively on the lateral sides of the press-fastening member to be hooked to the hook feet of the CPU holder, a through hole set on the longer and horizontal portion, a hook panel set on the top end of the retaining hole on the longer side; a press-holding portion set on the retaining member with a T-shaped reverse hook bent downwardly from the center of the bottom end and a retaining groove formed downwardly from the bottom end to be respectively and reversely fastened with the through hole and the hook panel by using the positional difference; so as to finish the assembly by affixing the heat sink device firmly to the CPU.

1 Claim, 4 Drawing Sheets

HEAT SINK DEVICE FASTENING STRUCTURE

BACKGROUND OF THE INVENTION

1) Field of the Invention

The invention herein of a heat sink device fastening structure is a fastening assembly for the computer CPU and the heat sink device to provide a fastening structure easy and convenient both for assembling and disassembling.

2) Description of the Prior Art

As is widely known, for the benefit of heat dissipation, usually a heat sink device will be attached to the CPU of the personal computer to maintain the stability of the computer operation. Since the continuous development of the high power rate of the integrated circuits and the reduced volumes of the chips, most of the CPU manufacturers will pivotally mount hook feet on the CPU holders for the corresponding fastening of the heat sink devices' assembling and disassembling in the future. There are various kinds of fastening structures on the market for assembling the computer CPU and the heat sink devices with obvious advantages, however, they all have different shortcomings as following:

1. complicated structure and assembly;
2. too many unit components and too much manufacturing time consumed;
3. too many assembly parts and increased manufacturing costs;
4. tool-depended and inconvenient for operation.

In view of the high production costs, various inconvenience of assembling and laboring caused by the shortcomings of the conventional fastening structure of the heat sink devices, the inventor of the invention herein, based on expertise and experience, addressed the said shortcomings by researching solutions for improvement and innovation which, culminated in the development of the invention herein.

SUMMARY OF THE INVENTION

Specifically, the invention herein comprises of a press-fastening member and a retaining member, wherein the two sides of the press-fastening member folded upwards in a bevel angle and with resilience, one side of the press-fastening member is longer than the other side for the assembler to exert and save the force, and a press-holding portion formed at the central holding portion for pressing the heat sink device onto the CPU, the retaining holes set respectively on the lateral sides of the press-fastening member to be hooked to the hook feet of the CPU holder, a through hole set at the horizontal end on the longer side, a hook panel protruding downwardly on the top end of the retaining hole on the longer side; the retaining member is designed to be assembled with the press-fastening member, a press-down portion with bevel surface set on the retaining member for the user to press and exert the force, with a T-shaped reverse hook bent downwardly from the center of the bottom end of the press-down portion to be respectively and retained with the through hole, a recessed frame-shaped retaining groove extended downwardly from the two sides of the bottom end to be hooked with the hook panel; the way to assemble the two members is first to laterally rotate and insert the T-shaped reverse hook into the through hole, then align the retaining groove with the hook panel, next rotate the T-shaped reverse hook back to the straight direction and use the positional difference to produce a holding force upward to allow the hook panel to be fastened to the retaining groove accordingly, at the same time, the T-shaped reverse hook will be hooked reversely with the through hole and thus fix the assembly. When fastening the assembly of the heat sink device and the CPU in using the forgoing structure, the user only needs to first hook the retaining hole on the shorter side to the hook foot of the CPU holder and use this as the supporting point to press down the press-down portion by the finger, then by using the resilience generated from the press-fastening member bent upwardly to easily hook the retaining hole on the other side to the other hook foot, thus to make the press-holding portion firmly hold against the heat sink device and enable the heat sink device to affix tightly to the CPU; on the other hand, pressing down the press-down portion will disconnect the retaining hole from the hook foot and release the press-holding portion so as to disassemble the engagement and achieve the objective of easily assembling.

Therefore, the primary objective of the invention herein is to provide a fastening structure for the heat sink device of less unit components and simplified construction for increasing the production speed and lowering the manufacturing costs.

Another objective of the invention herein is to provide a fastening structure for heat sink device for easy exertion and assembly to achieve the practical value of the convenience of manufacture and easy operation.

Another objective of the invention herein is to provide a fastening structure for the heat sink device requiring no extra tool for assembly to achieve the convenient objective for both the manufacturer and the user.

To enable a further understanding of the said objectives, the technological methods, and specific structural features of the invention herein, the brief description of the drawings below is followed by the detail description for additional elaboration.

DETAILED DESCRIPTION OF THE INVENTION

Figure 1:
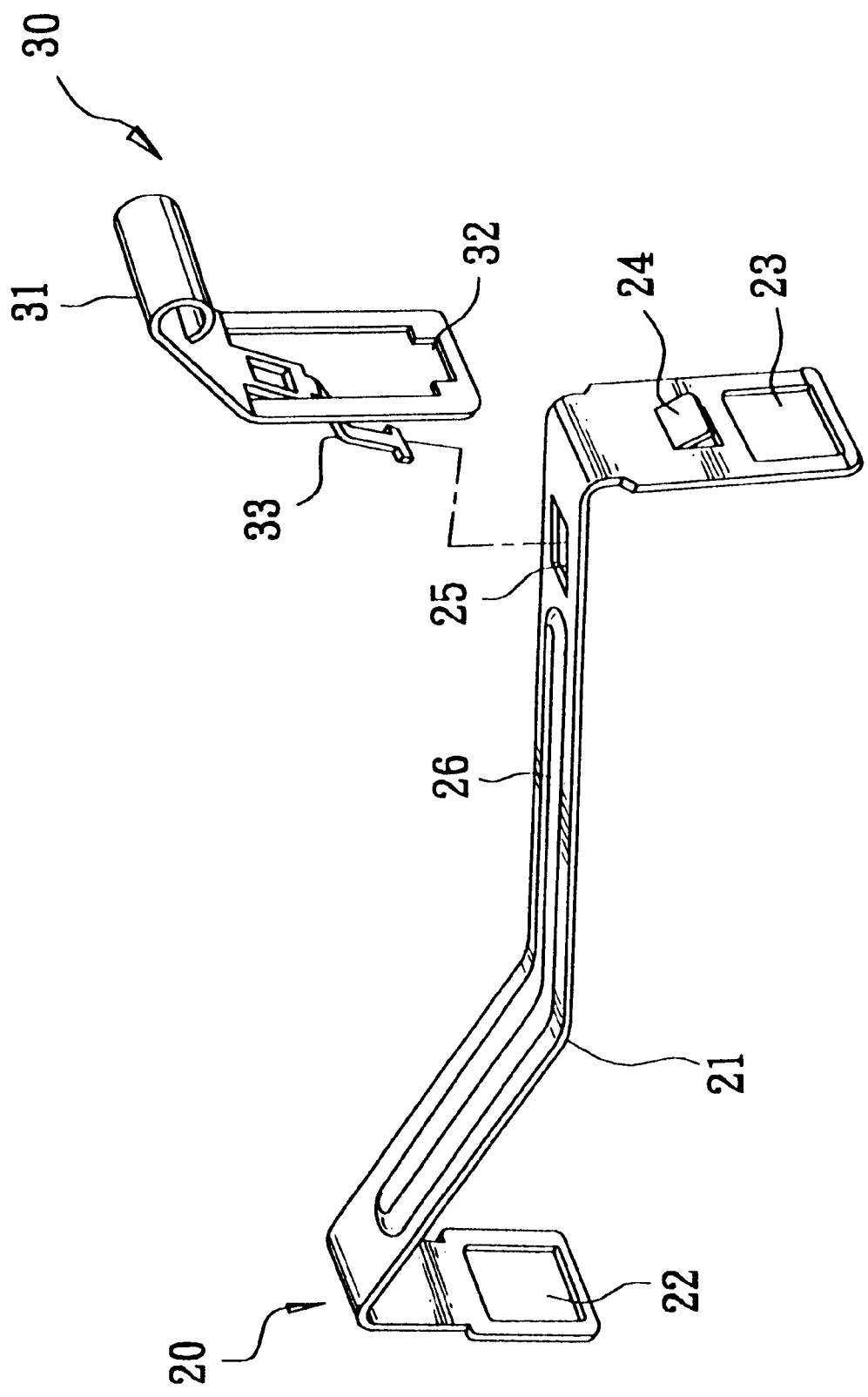
FIG. 1 is a drawing of the disassembled invention herein.

Referring to FIG. 1, the drawing of the disassembled heat sink device fastening structure of the invention herein showing the invention herein comprises a press-fastening member (20) and a retaining member (30), wherein the two ends of the press-holding portion (21) of the press-fastening member (20) extend and bend upwardly with one side longer than the other side advantageous for the assembler's exerting and saving force; the first retaining hole (22) set on the shorter side and the second retaining hole (23) set on the longer side; a hook panel (24) depending downwardly from the top of the second retaining hole (23), a through hole (25) in a rectangular shape set at the horizontal end on the longer side; furthermore, a reinforcing portion (26) set laterally at the central part of the press-fastening member (20) to avoid the possible bending and deformation caused by adding pressure; a press-down portion (31) with bevel surface set on the retaining member (30) acting like a force exerting point for pressing, a bent T-shaped reverse hook (33) extended downwardly from the center of the bottom end of the press-down portion (31) for inserting into the through hole (25) and to be reversally fastened thereat; furthermore, the recessed frame-shaped retaining groove (32) extended vertically and downwardly from the two sides of the bottom end of the press-down portion (31) for hooking and assembling with the hook panel (24).

Figure 2:
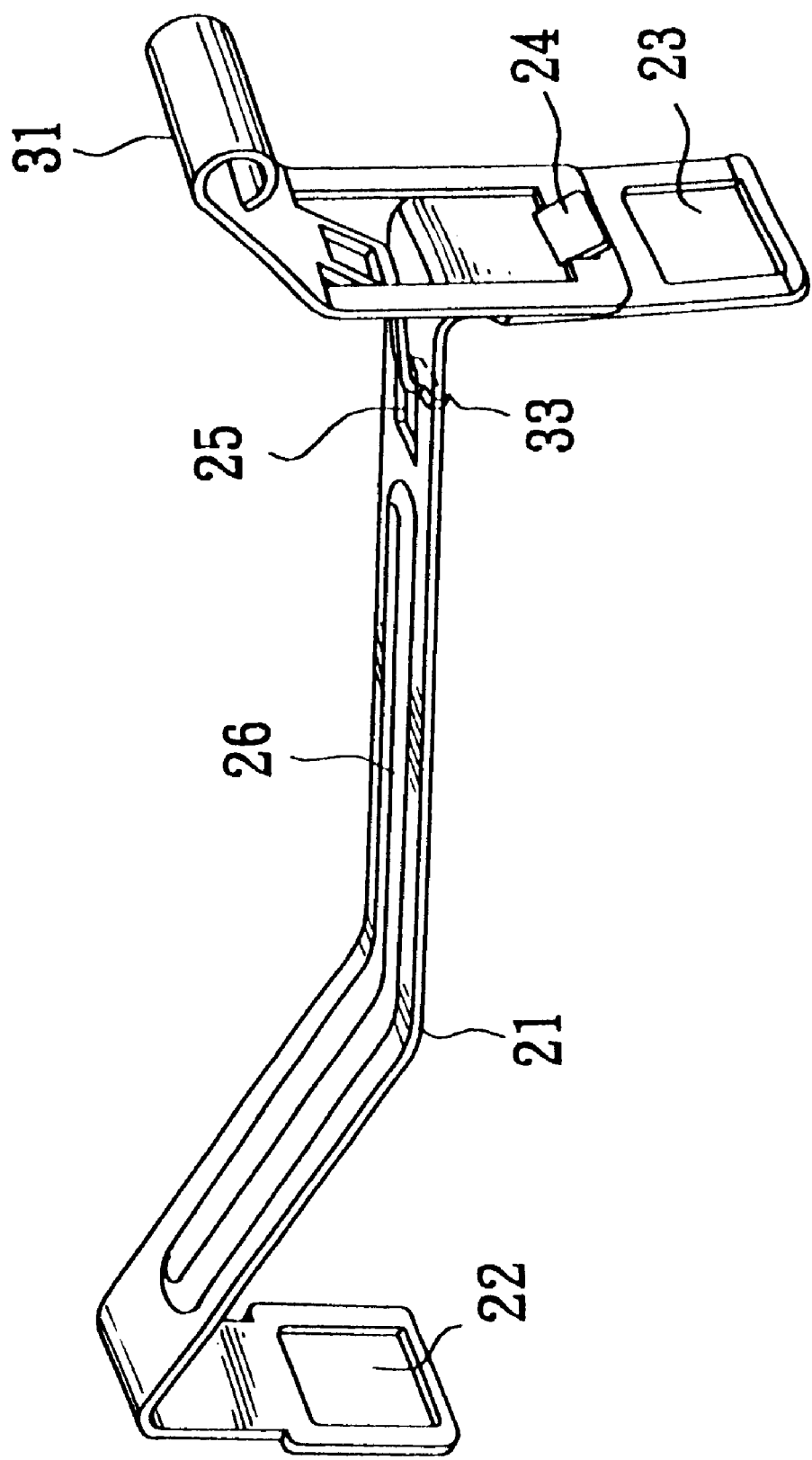
FIG. 2 is an isometric drawing of the assembled invention herein.

Referring to FIG. 2, the isometric drawing of the assembled heat sink device fastening structure of the invention herein, as the structure being assembled, since the length of the bottom end of the T-shaped reverse hook (33) is designed to be longer than the width of the rectangular through holes (25), therefore T-shaped reverse hook (33) needs to be laterally rotated in order to be inserted into the rectangular through hole (25), next align the retaining groove (32) with the hook panel (24) for fastening with the hook panel (24), then rotate the T-shaped reverse hook (33) counterclockwise or clockwise to the straight direction, at this time, the power of upward holding-against formed by the positional difference makes the hook panel (24) fasten into the retaining groove (32) accordingly and the T-shaped reverse hook (33) reversely fasten to the internal sides of the through hole synchronously without any loosening.

Figure 3:
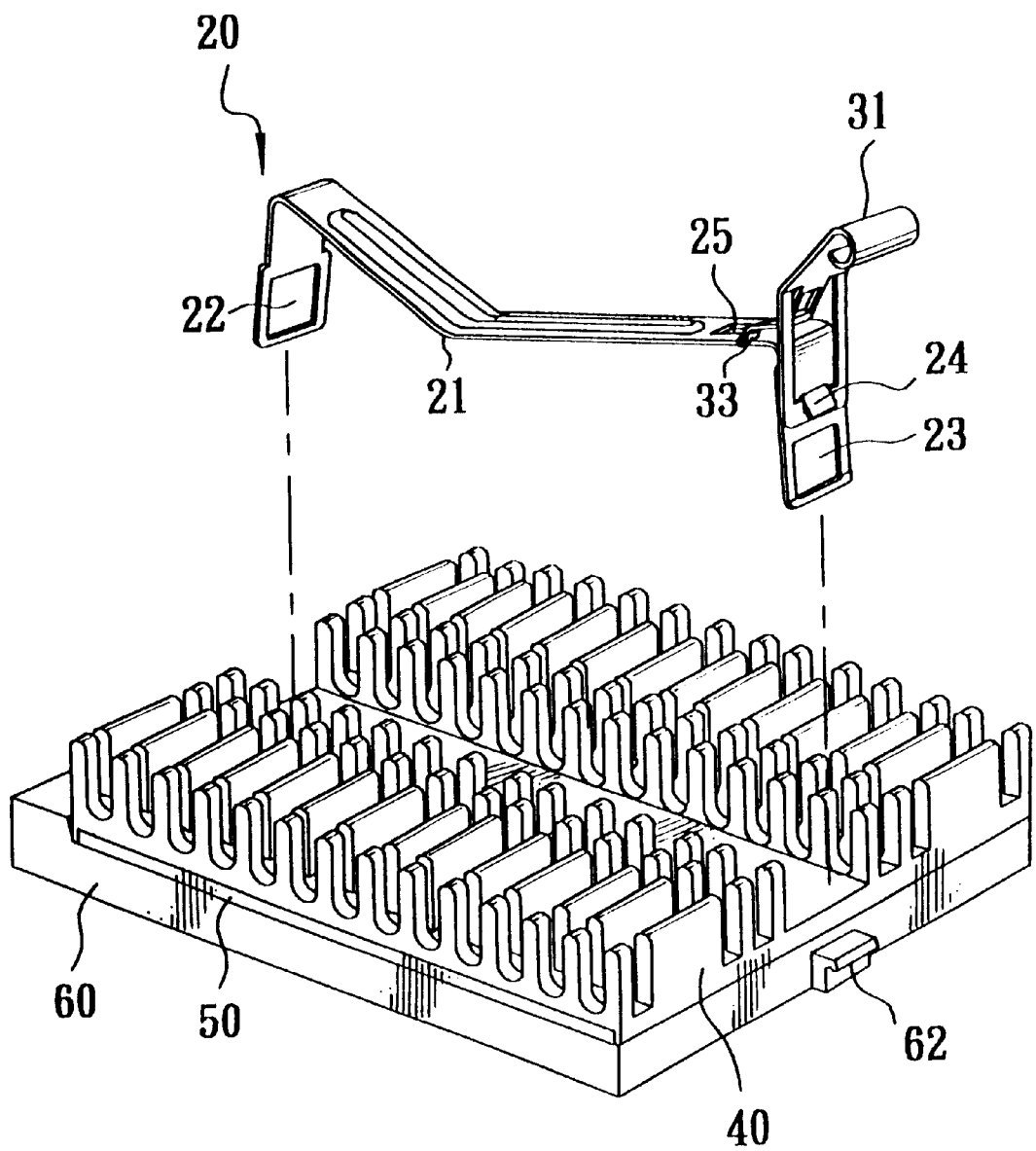
FIG. 3 is an isometric drawing of the assembly of the invention herein, the heat sink device and the CPU.
Figure 4:
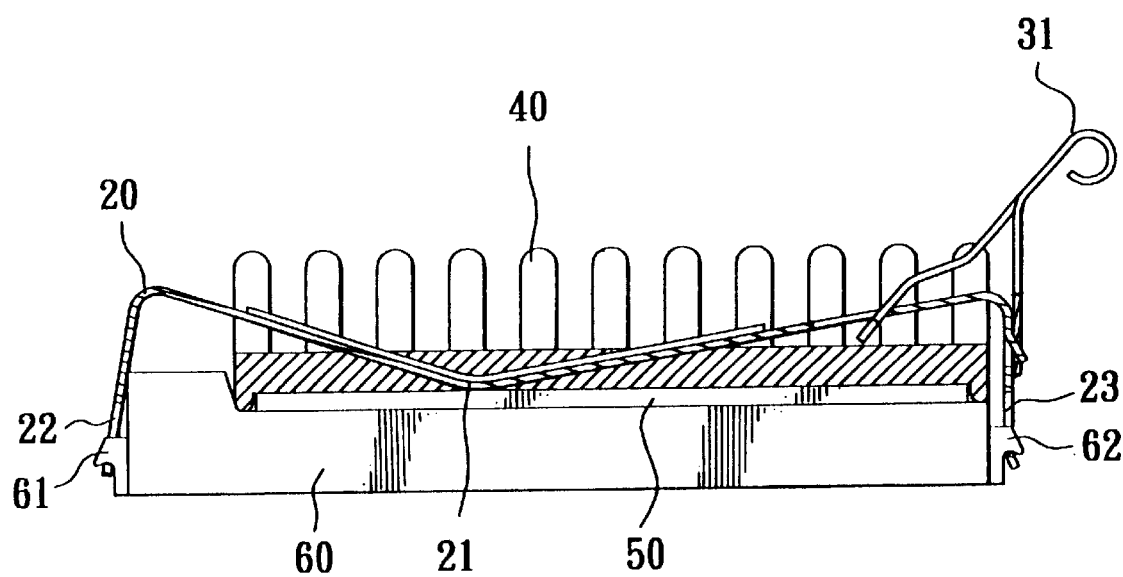
FIG. 4 is a drawing of the side and sectional view of the fastening of the invention herein, the heat sink device and the CPU.

Referring to the FIGS. 3 and 4, an isometric drawing of the assembly of the invention herein, the heat sink device and the CPU showing a preformed first hook foot (61) on the CPU holder (60) and the second hook foot (62) for the corresponding fastening with the first retaining hole (22) and the second retaining hole (23); when fastening and assembling the invention herein, the heat sink device and the CPU, after the CPU holder (60) being overlapped by the CPU (50) and the heat sink device (40), the first retaining hole (22) will be hooked downwardly to the first hook foot (61) of the CPU holder (60), then taking this as the supporting point to press down the press-down portion (31) by the finger, using the resilience of the upwardly slanted press-fastening member (20) to easily hook the second retaining hole (23) on the other side to the second hook foot (62), therefore, the press-holding portion (21) will be pressed firmly to the heat sink device (40) and affixed tightly to the CPU (50) to finish the assembling process; the assembly operation is simple and convenient for any one to handle with ease; on the other hand, pressing down the press-down portion (31) to disconnect the second retaining hole (23) from the second hook foot (62) to release the press-holding portion (21) for disassembling and achieving the objective of easy assembly.

Since one only needs to laterally rotate the T-shaped reverse hook (33) to be inserted into the through hole (25) and rotate clockwise or counterclockwise to easily fasten in a very simple operation, furthermore, the retaining member (30) is overlapped on the top of the longer side to form a longer force exerting lever, furthermore, the exist of the supporting point jointed respectively by the T-shaped reverse hook (33) with the through hole and the retaining groove (32) with the hook panel (24) makes the force exertion become very easy.

In summation of the foregoing section, the Heat Sink Device Fastening Structure providing an innovative and practical fastening structure which specifically and efficiently improving the inconvenience caused by the assembly and the disassembly of the conventional structure is an invention of reasonable perfection of economical benefits, therefore, the invention herein fully complies with all new patent application requirements and hereby sincerely submitted to the patent bureau for review and the grating of the commensurate patent rights.

What is claimed is:

1. A fastening device for attaching a heat sink to a CPU mounted on a CPU holder comprising: a press-fastening member and a retaining member, wherein the press-fastening member is a resilient elongated strip bent upwardly forming a first side and a second side, the first side being longer than the second side, a press-holding portion is formed between the first and the second sides; a distal end of the second side is bent downward forming a first bent portion, the first bent portion has a first retaining hole to be engaged with a first hook foot of the CPU holder, a distal end of the first side is bent downward forming a second bent portion, the second bent portion has a second retaining hole to be engaged with a second hook foot of the CPU holder and a hook panel extending downward as a barb above the second retaining hole, a through hole is disposed on the first side of the press-fastening member adjacent to the second bent portion; and wherein the retaining member is a V-shaped strip comprising a press-down portion and a frame-shaped portion extending downward from the press-down portion and the frame-shaped portion having a retaining groove at a distal lower end to be engaged with the hook panel of the press-fastening member, a T-shaped reverse hook extends downward from the press-down portion and bent toward the through hole of the press-fastening member, the T-shaped reverse hook is inserted into the through hole and is engaged with the press-fastening member.

* * * * *